United States Patent
Jeon

(10) Patent No.: US 10,101,366 B2
(45) Date of Patent: Oct. 16, 2018

(54) PROTECTIVE RELAYING SYSTEM AND METHOD FOR GATHERING DATA USING THEREOF

(71) Applicant: LSIS CO., LTD., Anyang-si, Gyeonggi-do (KR)

(72) Inventor: Byung Joon Jeon, Cheongju-si (KR)

(73) Assignee: LSIS CO., LTD., Anyang-si, Gyeonggi-Do (KR)

(*) Notice: Subject to any disclaimer, the term of this patent is extended or adjusted under 35 U.S.C. 154(b) by 479 days.

(21) Appl. No.: 14/733,741

(22) Filed: Jun. 8, 2015

(65) Prior Publication Data
US 2015/0355236 A1     Dec. 10, 2015

(30) Foreign Application Priority Data
Jun. 9, 2014 (KR) .................... 10-2014-0069555

(51) Int. Cl.
*G01R 1/36* (2006.01)
*H02H 3/02* (2006.01)
(Continued)

(52) U.S. Cl.
CPC ............ *G01R 1/36* (2013.01); *G01R 31/343* (2013.01); *H02H 1/0061* (2013.01);
(Continued)

(58) Field of Classification Search
CPC .................................. G01R 1/36; G01R 31/343
See application file for complete search history.

(56) References Cited

U.S. PATENT DOCUMENTS 2,883,255 A * 4/1959 Anderson ............... B41J 11/36
340/518
3,641,530 A * 2/1972 Schoenwitz ............ G06F 3/147
340/870.13
(Continued)

FOREIGN PATENT DOCUMENTS

CN       201440214       4/2010
CN       101978702       2/2011
(Continued)

OTHER PUBLICATIONS

State Intellectual Property Office of the People's Republic of China Application Serial No. 201510313147.0, Office Action dated Jun. 5, 2017, 8 pages.
(Continued)

*Primary Examiner* — John Breene
*Assistant Examiner* — Yaritza H Perez Bermudez
(74) *Attorney, Agent, or Firm* — K&L Gates LLP

(57) ABSTRACT

A protective relaying system and a data collection method thereof capable of enhancing a data collection efficiency and effectiveness is provided. The protective relaying system may include a plurality of protective relaying modules respectively connected to a switch to control the operation of the switch; a server module coupled to one of the plurality of protective relaying modules, and connected to the plurality of protective relaying modules, respectively, to sequentially collect and store data of the plurality of protective relaying modules; and a remote monitoring unit connected to the server module to collectively receive and collect the stored data of the plurality of protective relaying modules from the server module.

9 Claims, 5 Drawing Sheets

(51) Int. Cl.

| | | |
|---|---|---|
| *G01R 31/34* | (2006.01) | |
| *H02H 7/085* | (2006.01) | |
| *H04L 12/26* | (2006.01) | |
| *H02H 1/00* | (2006.01) | |
| *H02H 7/26* | (2006.01) | |
| *H02H 7/08* | (2006.01) | |

(52) U.S. Cl.
CPC .......... *H02H 1/0084* (2013.01); *H02H 3/025* (2013.01); *H02H 7/0822* (2013.01); *H02H 7/0856* (2013.01); *H02H 7/261* (2013.01); *H02H 7/263* (2013.01); *H04L 43/0823* (2013.01); *H04L 43/16* (2013.01)

(56) References Cited

U.S. PATENT DOCUMENTS

| | | | | | |
|---|---|---|---|---|---|
| 3,824,430 | A | * | 7/1974 | Hentschel | H02H 3/13 361/175 |
| 4,743,816 | A | * | 5/1988 | Prather | H02P 1/28 318/430 |
| 5,057,962 | A | * | 10/1991 | Alley | H02H 6/005 318/783 |
| 6,005,758 | A | * | 12/1999 | Spencer | H02H 3/04 361/64 |
| 6,157,527 | A | * | 12/2000 | Spencer | H02H 3/04 361/102 |
| 6,539,287 | B1 | | 3/2003 | Ashizawa | |
| 6,618,648 | B1 | * | 9/2003 | Shirota | G01R 31/088 700/286 |
| 6,650,245 | B2 | * | 11/2003 | Chung | H01H 9/542 318/757 |
| 7,403,015 | B2 | * | 7/2008 | Carlino | H02H 1/0061 324/424 |
| 7,711,522 | B2 | * | 5/2010 | Gualandri | G05B 23/0283 340/870.01 |
| 7,953,828 | B2 | * | 5/2011 | Huaguang | G01D 4/004 709/220 |
| 8,326,538 | B2 | * | 12/2012 | Hobbs | E21B 47/12 175/40 |
| 8,356,321 | B2 | * | 1/2013 | Pham | H04N 7/17318 348/468 |
| 8,984,180 | B2 | * | 3/2015 | Jeon | H02H 1/0061 709/217 |
| 9,253,454 | B2 | * | 2/2016 | Hobbs | E21B 47/12 |
| 9,400,867 | B2 | * | 7/2016 | Boyd | G06F 11/3013 |
| 9,411,705 | B2 | * | 8/2016 | Jeon | G06F 9/542 |
| 9,705,305 | B2 | * | 7/2017 | Dolezilek | H02H 1/0061 |
| 2003/0200038 | A1 | * | 10/2003 | Schweitzer, III | H02H 1/0007 702/65 |
| 2006/0146469 | A1 | * | 7/2006 | Heagerty | G08C 17/02 361/115 |
| 2006/0176630 | A1 | * | 8/2006 | Carlino | H02H 1/0061 361/64 |
| 2007/0174451 | A1 | * | 7/2007 | Huaguang | G01D 4/004 709/224 |
| 2008/0059081 | A1 | * | 3/2008 | Gualandri | G05B 23/0283 702/34 |
| 2008/0115512 | A1 | * | 5/2008 | Rizzo | B60H 1/00428 62/134 |
| 2008/0225457 | A1 | * | 9/2008 | Korrek | G05B 9/02 361/100 |
| 2009/0070825 | A1 | * | 3/2009 | Pham | H04N 7/17318 725/68 |
| 2010/0057225 | A1 | * | 3/2010 | Allcock | H02H 1/0061 700/79 |
| 2010/0250139 | A1 | * | 9/2010 | Hobbs | E21B 47/12 702/6 |
| 2011/0116196 | A1 | * | 5/2011 | Kellis | H02H 7/0816 361/30 |
| 2011/0181269 | A1 | * | 7/2011 | Watkins | G01R 29/18 324/76.77 |
| 2011/0228429 | A1 | * | 9/2011 | Ueta | B60N 2/0232 361/31 |
| 2012/0032519 | A1 | * | 2/2012 | Watts | H02J 3/46 307/99 |
| 2012/0226386 | A1 | * | 9/2012 | Kulathu | H02J 13/0079 700/295 |
| 2013/0035800 | A1 | * | 2/2013 | Kulathu | H02J 3/14 700/295 |
| 2013/0067251 | A1 | * | 3/2013 | Jeon | H02H 1/0061 713/300 |
| 2013/0076907 | A1 | * | 3/2013 | Hobbs | E21B 47/12 348/158 |
| 2013/0107407 | A1 | * | 5/2013 | Pan | H02H 3/305 361/87 |
| 2013/0215543 | A1 | * | 8/2013 | Hoeven | H02H 3/081 361/63 |
| 2013/0322907 | A1 | * | 12/2013 | Namiki | G03G 13/20 399/69 |
| 2014/0062401 | A1 | * | 3/2014 | Gadh | B60L 11/1838 320/109 |
| 2014/0074409 | A1 | * | 3/2014 | Boyd | G06F 11/3013 702/35 |
| 2015/0029934 | A1 | * | 1/2015 | Yamazaki | H04W 64/00 370/328 |
| 2015/0067408 | A1 | * | 3/2015 | Jeon | G06F 9/542 714/47.1 |
| 2015/0311714 | A1 | * | 10/2015 | Dolezilek | H02J 13/0013 700/286 |
| 2015/0355236 | A1 | * | 12/2015 | Jeon | G01R 1/36 702/58 |
| 2016/0036633 | A1 | * | 2/2016 | Lee | H04L 41/085 709/221 |
| 2018/0008850 | A1 | * | 1/2018 | Scheffer | F04D 15/00 |

FOREIGN PATENT DOCUMENTS

| | | |
|---|---|---|
| CN | 102842960 | 12/2012 |
| CN | 103529779 A | 1/2014 |
| EP | 2618502 | 7/2013 |
| JP | 201210057 | 1/2012 |
| KR | 1019980010713 | 4/1998 |
| KR | 100832324 B1 | 5/2008 |

OTHER PUBLICATIONS

European Patent Office Application Serial No. 15170275.0, Search Report dated Oct. 6, 2015, 4 pages.

* cited by examiner

PROTECTIVE RELAYING SYSTEM AND METHOD FOR GATHERING DATA USING THEREOF

CROSS-REFERENCE TO RELATED APPLICATIONS

Pursuant to 35 U.S.C. § 119(a), this application claims the benefit of earlier filing date and right of priority to Korean Patent Application No. 10-2014-0069555, filed on Jun. 9, 2014, the contents of which are all hereby incorporated by reference herein in its entirety.

BACKGROUND OF THE INVENTION

1. Field of the Invention

The present disclosure relates to a protective relaying system, and more particularly, to a protective relaying system for coupling a server module having duplex communication channels to one of a plurality of protective relaying modules in an electric motor protection relay (EMPR) to allow effective data collection from the plurality of protective relaying modules and a data collection method thereof.

2. Description of the Related Art

In general, a motor protection relay is a device for correctly detecting over-current, phase loss, phase imbalance, reverse phase generated during the startup and operation of a motor by a set operation time to reliably protect the motor.

The motor protection relay converts and outputs a current of the motor through a current transformer, and drives a relay to open a closed contact point when the converted output value is abnormal, thereby blocking power supplied to the motor through the closed contact point to perform motor damage prevention and protection.

In recent years, line control has been computerized while actively carrying out factory automation systems in various industrial fields, and due to this, it is configured with a complex apparatus including a motor protection relay having a plurality of protective relaying modules and a monitoring unit for collecting data therefrom to monitor the line.

FIG. 1 is a view illustrating the configuration of a motor protective relaying system, and FIG. 2 is a view illustrating the configuration of a protective relaying module in FIG. 1.

Referring to FIGS. 1 and 2, a motor protective relaying system in the related art may include a motor protection relay 1, a motor 40 and a remote monitoring unit 30 connected thereto.

The motor protection relay 1 may include a plurality of protective relaying modules 10 and switches 20 connected to the plurality of protective relaying modules 10, respectively, therein. Here, the switches 20 are connected to the motors 40, respectively.

Each of the protective relaying modules 10 is connected to the remote monitoring unit 30 through a communication line 35. Furthermore, the buffer layer 10 performs data communication with the remote monitoring unit 30 through the communication line 35 to transmit data stored therein to the remote monitoring unit 30.

Each of the protective relaying modules 10 may include an MCU 11, a voltage/current sensing unit 12, a memory 13, an input/output port 14, a communication unit 15 and a display unit 16.

The voltage/current sensing unit 12 senses and outputs a current supplied to the motor 40 and a voltage of a power line 50 inputted to the protective relaying module 10. The voltage/current sensing unit 12 senses voltage and current signals from a potential transformer (PT) or current transformer (CT), respectively, and convert and output the sensed voltage and current signals into digital data.

The MCU 11 generates power data from the voltage and current data outputted from the voltage/current sensing unit 12 through various operations. Furthermore, the MCU 11 receives status information from the motor 40 connected to the switch 20 to generate status data. The power data and status data generated by the MCU 11 is stored in the memory 13 as event data.

The MCU 11 compares the event data with reference data stored in the memory 13, and generates a control signal controlling the operation of the switch 20 according to the comparison result. The control signal controls an opening and closing operation of the switch 20 to prevent the damage of the motor 40.

The foregoing MCU 11 receives or outputs various signals through the input/output port 14.

The display unit 16 displays the power data and status data provided from the MCU 11 for a user.

The communication unit 15 is connected to the remote monitoring unit 30 through the communication line 35. The communication unit 15 receives a data request signal from the remote monitoring unit 30, and transmits event data stored in the memory 13 to the remote monitoring unit 30 according to the control of the MCU 11.

The communication unit 15 may have unique ID information, for instance, a station number, and operates in response to calling the relevant station number by the remote monitoring unit 30. Here, the communication unit 15 is connected to the remote monitoring unit 30 through a wired communication scheme via RS-485 cable. Furthermore, the communication unit 15 and remote monitoring unit 30 perform data communication with each other through a half-duplex communication scheme.

FIG. 3 is a flow chart illustrating a data collection operation of a motor protective relaying system in the related art.

Referring to FIGS. 1 through 3, the remote monitoring unit 30 scans a plurality of protective relaying modules 10 in the motor protection relay 1 (S10). In other words, the remote monitoring unit 30 checks a communication connection to the communication unit 15 of the plurality of protective relaying modules 10, respectively, through the communication line 35.

When a communication connection between the remote monitoring unit 30 and the plurality of protective relaying modules 10 is acknowledged, the remote monitoring unit 30 requests data to the plurality of protective relaying modules 10, respectively, for which the connection is confirmed (S20).

Here, the remote monitoring unit 30 sequentially requests data to a plurality of protective relaying modules 10. For instance, when a first protective relaying module 10 through an n-th protective relaying module 10 are provided in the motor protection relay 1 and a communication connection to those modules is confirmed, the remote monitoring unit 30 sequentially requests data to the first protective relaying module 10 through the n-th protective relaying module 10.

The motor protection relay 1 sequentially transmits data from the first protective relaying module 10 to the n-th protective relaying module 10 to the remote monitoring unit 30 (S30).

When data is transmitted from the last protective relaying module 10, the remote monitoring unit 30 releases data communication with the plurality of protective relaying modules 10 and completes data collection (S40).

However, as described above, since a motor protective relaying system in the related art sequentially carries out data communication between the remote monitoring unit 30 and the plurality of protective relaying modules 10 in the motor protection relay 1, a lot of communication time is consumed to allow the remote monitoring unit 30 to complete data collection for the entire protective relaying modules 10.

For instance, if a communication time consumed between one protective relaying module 10 and the remote monitoring unit 30 is "A" seconds (s), then a communication time consumed between the entire plurality of protective relaying modules 10 and the remote monitoring unit 30 becomes "A*N (number of protective relaying modules)".

In other words, as the number of protective relaying modules 10 within the motor protection relay 1 increases in the motor protective relaying system in the related art, a communication time between the remote monitoring unit 30 and the motor protection relay 1 increases. An increase of such a communication time may reduce the latest effectiveness of the collected data, thereby causing an error in performing the monitoring and control of the motor.

SUMMARY OF THE INVENTION

A protective relaying system and a data collection method thereof capable of enhancing a data collection efficiency and effectiveness is provided. A protective relaying system may include a plurality of protective relaying modules respectively connected to a switch to control the operation of the switch; a server module coupled to one of the plurality of protective relaying modules, and connected to the plurality of protective relaying modules, respectively, to sequentially collect and store data of the plurality of protective relaying modules; and a remote monitoring unit connected to the server module to collectively receive and collect the stored data of the plurality of protective relaying modules from the server module.

In order to accomplish the foregoing objective, a protective relaying system according to an embodiment of the present disclosure may include a plurality of protective relaying modules respectively connected to a switch to control the operation of the switch; a server module coupled to one of the plurality of protective relaying modules, and connected to the plurality of protective relaying modules, respectively, to sequentially collect and store data of the plurality of protective relaying modules; and a remote monitoring unit connected to the server module to collectively receive and collect the stored data of the plurality of protective relaying modules from the server module.

The server module may include a first communication channel and a second communication channel. The server may be connected to the plurality of protective relaying modules, respectively, through the first communication channel to collect the data of the plurality of protective relaying modules, and connected to the remote monitoring unit through the second communication channel to transmit the data of the plurality of protective relaying modules to the remote monitoring unit.

The server module may collect and transmit the data of the plurality of protective relaying modules using the first communication channel and the second communication channel.

The second communication channel may be connected to the remote monitoring unit through one of a wired communication scheme and a wireless communication scheme to perform data communication with the remote monitoring unit in a half-duplex communication mode.

The server module may further include a storage unit configured to store the collected data of the plurality of protective relaying modules, and the data of the plurality of protective relaying modules may be stored therein to contain ID information of each protective relaying module.

The server module may operate by receiving driving power from the one protective relaying module coupled thereto.

In order to accomplish the foregoing objective, a data collection method of a protective relaying system according to an embodiment of the present disclosure may include allowing a server module to scan a plurality of protective relaying modules, respectively, so as to store ID information of the plurality of protective relaying modules, respectively; allowing the server module to sequentially collect and store data from the plurality of protective relaying modules according to the stored ID information; and allowing the server module to collectively transmit the stored data to a remote monitoring unit in response to a data request of the remote monitoring unit.

Said storing the ID information of the plurality of protective relaying modules, respectively, may include transmitting a call signal to the plurality of protective relaying modules, respectively, and receiving a response signal to the call signal from the plurality of protective relaying modules; and extracting and storing the ID information of the plurality of protective relaying modules, respectively, from the received response signal.

Furthermore, said storing the ID information of the plurality of protective relaying modules, respectively, may further include determining whether the stored ID information corresponds to the last protective relaying module of the plurality of protective relaying modules; and allowing the server module to continuously perform scanning on the plurality of protective relaying modules or sort the stored ID information according to a result of the determination.

Said sequentially collecting and storing data from the plurality of protective relaying modules may include outputting a data request signal to the plurality of protective relaying modules, respectively, according to the stored ID information; and collecting and storing data transmitted from the plurality of protective relaying modules, respectively, according to the data request signal.

The server module may complete data collection from a protective relaying module corresponding to one ID information among the plurality of protective relaying modules, and then perform data collection from a protective relaying module corresponding to another ID information.

The server module may store data collected from the plurality of protective relaying modules, respectively, to match the ID information.

The server module may perform sequentially collecting and storing data from the plurality of protective relaying modules and collectively transmitting the stored data to the remote monitoring unit at the same time.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

The objective of the present invention, as well as the configuration and working effect thereof to accomplish the foregoing objective will be more clearly understood by the following description for the preferred embodiments of present disclosure with reference to the accompanying drawings.

Figure 1:
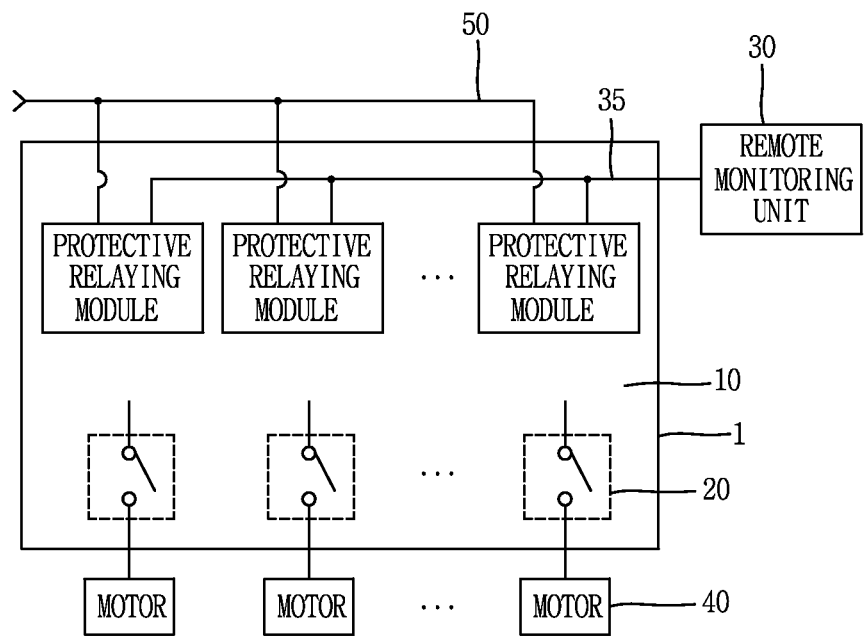
FIG. 1 is a view illustrating the configuration of a motor protective relaying system in the related art.
Figure 2:
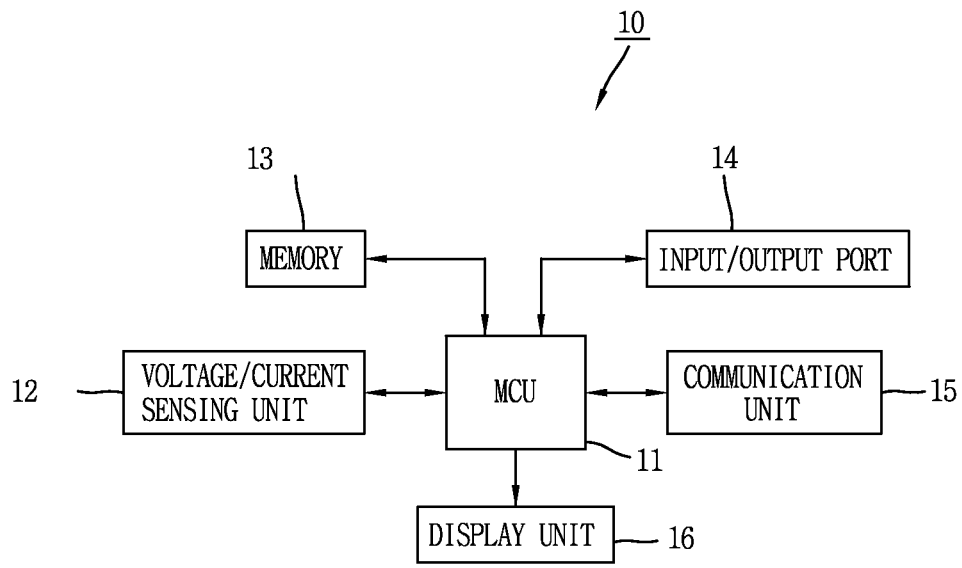
FIG. 2 is a view illustrating the configuration of a protective relaying module in FIG. 1.
Figure 3:
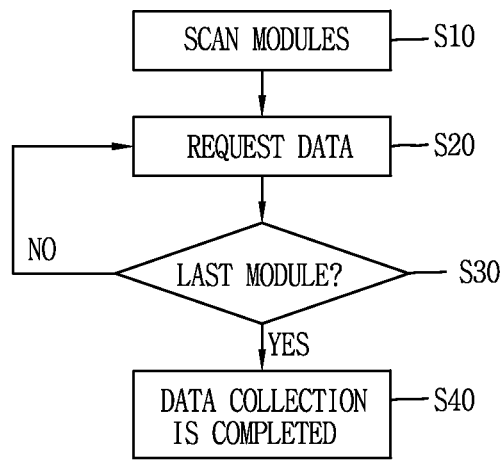
FIG. 3 is a flow chart for a data collection operation of a motor protective relaying system in the related art.
Figure 4:
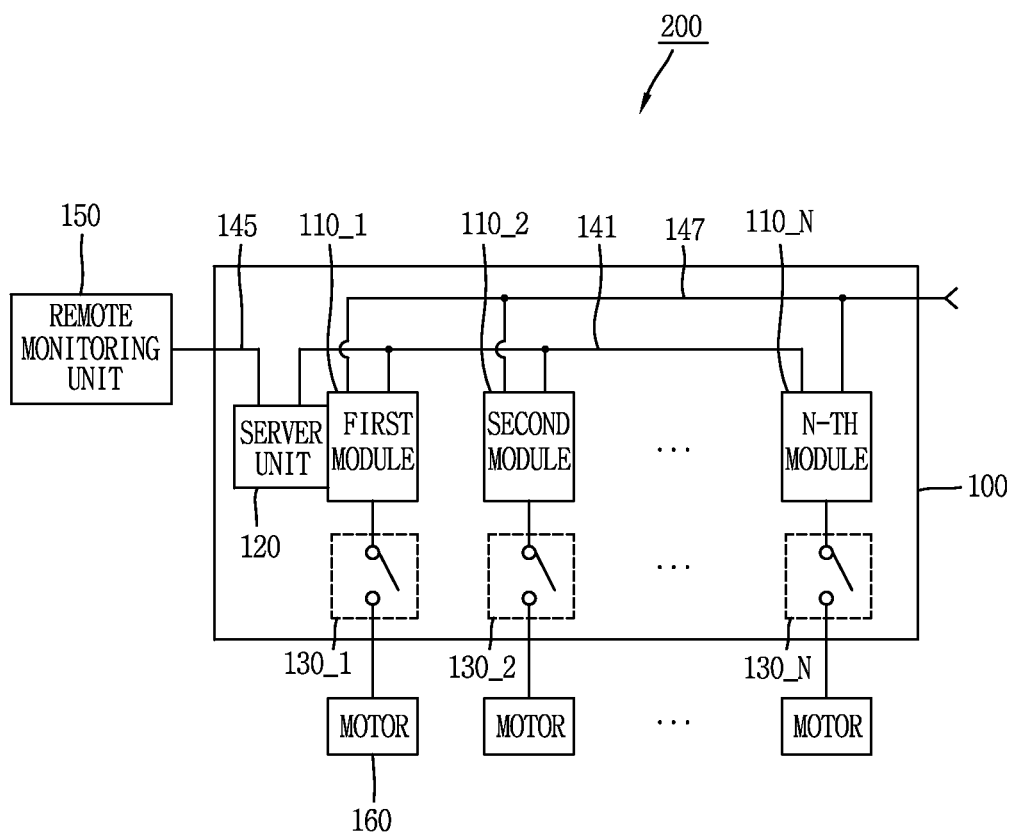
FIG. 4 is a view illustrating the configuration of a protective relaying system according to an embodiment of the present disclosure.

FIG. 4 is a view illustrating the configuration of a protective relaying system according to an embodiment of the present disclosure.

Referring to FIG. 4, a protective relaying system 200 according to the present embodiment may include a motor protection relay 100 and a remote monitoring unit 150.

The motor protection relay 100 may be connected to a plurality of motors 160 to detect a voltage and current failure or motor itself failure while driving the plurality of motors 160 to prevent the damage of the plurality of motors 160. The motor protection relay 100 may include a plurality of protective relaying modules 110_1~110_N and a plurality of switches 130_1~130_N.

The plurality of protective relaying modules 110_1~110_N, respectively, may provide a voltage and current provided through a power line 147 from the outside to the motor 160 through the switches 130_1~130_N connected to the plurality of protective relaying modules 110_1~110_N, respectively, in a corresponding manner.

The plurality of protective relaying modules 110_1~110_N, respectively, may detect a failure of voltage and current applied through the power line 147 or a failure of the motor 160 connected to the plurality of switches 130_1~130_N, thereby opening or closing the plurality of switches 130_1~130_N to protect the motor 160.

One of the plurality of protective relaying modules 110_1~110_N may be coupled to a server module 120. The light guide plate 120 may collect data from the plurality of protective relaying modules 110_1~110_N.

For instance, the server module 120 may be coupled to a first protective relaying module 110_1 among the plurality of protective relaying modules 110_1~110_N. Furthermore, the server module 120 may be connected to the plurality of protective relaying modules 110_1~110_N including the first protective relaying module 110_1 through an internal communication line 141 of the motor protection relay 100.

The server module 120 may request data to the plurality of protective relaying modules 110_1~110_N through the internal communication line 141.

The plurality of protective relaying modules 110_1~110_N may transmit data that has been stored based on a data request of the server module 120, for instance, event data for a voltage, a current, a motor status or the like in each of the protective relaying modules 110_1~110_N, to the server module 120. Furthermore, the server module 120 may store the transmitted event data of the plurality of protective relaying modules 110_1~110_N, respectively.

Here, the server module 120 may request data to the plurality of protective relaying modules 110_1~~110_N with a preset time interval, and store event data transmitted from the plurality of protective relaying modules 110_1~110_N according to the request.

The server module 120 and the plurality of protective relaying modules 110_1~110_N may be connected to each other using a wire communication scheme, and herein, a RS-485 cable, a coaxial cable, a UTP cable, an optical fiber cable or the like may be used for the internal communication line 141.

The server module 120 and the plurality of protective relaying modules 110_1~110_N may perform data communication in a half-duplex communication mode using an industrial protocol such as its own protocol or MODBUS, distributed network protocol (DNP) or the like.

Furthermore, the server module 120 may be connected to an external system, such as the remote monitoring unit 150, through an external communication line 145.

The server module 120 may collectively transmit the event data of the plurality of protective relaying modules 110_1~110_N that has been previously collected from the plurality of protective relaying modules 110_1~110_N, respectively, to the remote monitoring unit 150 through the external communication line 145 according to a data request of the remote monitoring unit 150.

Here, the remote monitoring unit 150 may request data to the server module 120 with a preset time interval, and the server module 120 may transmit the prestored event data of the plurality of protective relaying modules 110_1~110_N to the remote monitoring unit 150 in response to this.

Furthermore, the remote monitoring unit 150 may request data to the server module 120 when there is a data collection command at a specific time, for instance, from an administrator, and the server module 120 may transmit the prestored event data of the plurality of protective relaying modules 110_1~110_N to the remote monitoring unit 150 in response to this.

The server module 120 and the remote monitoring unit 150 may be connected to each other using a wired communication scheme, and herein, a RS-485 cable, a coaxial cable, a UTP cable, an optical fiber cable or the like may be used for the external communication line 145.

Furthermore, the server module 120 and the remote monitoring unit 150 may be connected to each other using a wireless communication scheme. Here, the external communication line 145 may be a wireless communication line such as Zigbee, Ethernet, Bluetooth, or the like.

The server module 120 and the remote monitoring unit 150 may perform data communication in a half-duplex communication mode using an industrial protocol such as its own protocol or MODBUS, distributed network protocol (DNP) or the like.

The remote monitoring unit 150 may transmit a data request signal to the server module 120 through the external communication line 145, and the server module 120 may collect and store event data of the plurality of protective relaying modules 110_1~110_N, respectively, transmitted in response to this. The remote monitoring unit 150 may collectively receive the event data of the plurality of protective relaying modules 110_1~110_N, respectively, through the server module 120.

Accordingly, the protective relaying system 200 according to the present disclosure may significantly reduce a data collection time for the motor protection relay 100 of the remote monitoring unit 150 compared to the protective relaying system in the related art, thereby enhancing the efficiency of data collection.

Furthermore, immediate manifestation may be allowed for an administrator due to speedy data collection to enhance the effectiveness of collection data, thereby increasing monitoring reliability for the motor protection relay 100 of the protective relaying system 200.

On the other hand, the remote monitoring unit 150 may request and collect only specific data among the event data of the plurality of protective relaying modules 110_1~110_N, respectively, stored in the server module 120.

For instance, in a state that voltage, current and motor status data for the plurality of protective relaying modules 110_1~110_N are collected and stored in the server module 120, the remote monitoring unit 150 may request and collect only voltage data for the plurality of protective relaying modules 110_1~110_N to the server module 120.

In other words, the remote monitoring unit 150 may request and collect all event data for the plurality of protective relaying modules 110_1~110_N from the server module 120, but according to circumstances, request only specific data to quickly collect them so as to immediately manifest them to the administrator.

Figure 5:
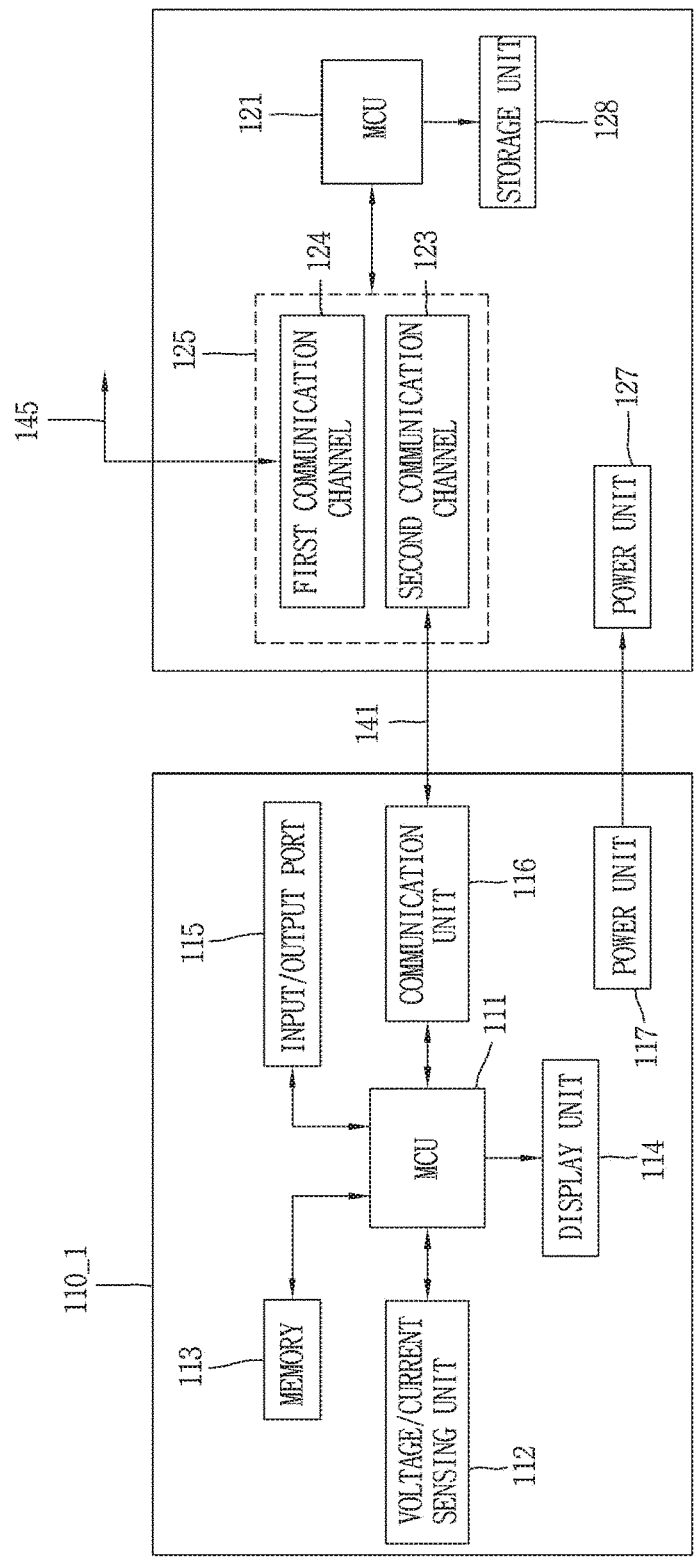
FIG. 5 is a view illustrating the configuration and connection between a protective relaying module and a server module illustrated in FIG. 4.

FIG. 5 is a view illustrating the configuration and connection between a protective relaying module and a server module illustrated in FIG. 4.

Referring to FIGS. 4 and 5, one of the plurality of protective relaying modules 110_1~110_N, for instance, the first protective relaying module 110_1, may be coupled to the server module 120.

The first protective relaying module 110_1 may include a voltage/current sensing unit 112, a memory 113, a display unit 114, an input/output port 115, a communication unit 116 and a power unit 117.

The power unit 117 of the first protective relaying module 110_1 may be connected to a power unit 127 of the server module 120. The first protective relaying module 110_1 may provide driving power to the power unit 127 of the server module 120 through the power unit 117.

The voltage/current sensing unit 112 of the first protective relaying module 110_1 may sense and output a current and voltage applied from the power line 147. For instance, the voltage/current sensing unit 112 may sense voltage and current signals, respectively, from an instrument transformer (not shown) or instrument current transformer (not shown). Furthermore, the voltage/current sensing unit 112 may convert the sensed voltage and current signals into digital data to output the voltage and current data.

An MCU 111 of the first protective relaying module 110_1 may perform various operations with respect to the voltage and current data outputted from the voltage/current sensing unit 112, and generate an amount of power, for instance, power data, therefrom.

Furthermore, the MCU 111 may generate status data according to the status information of the motor 160 connected to a switch 1301.

The power data and status data generated from the MCU 111 may be stored as event data in the memory 113.

In addition, the MCU 111 may compare event data with reference data, and control the operation of the switch 130_1 according to a result of the comparison.

Specifically, reference data, for instance, reference power data or reference status data, for the first protective relaying module 110_1 may be stored in the memory 113. The MCU 111 may compare the generated event data with reference stored in the memory 113, and generate a control signal according to a result of the comparison. Furthermore, the MCU 111 may output the control signal to the switch 130_1 to control an opening or closing operation of the switch 130_1, thereby preventing the damage of the motor 160.

The input/output port 115 of the first protective relaying module 110_1 may transfer a signal applied from the outside, for instance, a motor status signal, to the MCU 111 or transfer a control signal generated from the MCU 111 to the switch 130_1.

The display unit 114 of the first protective relaying module 110_1 may receive event data from the MCU 111, and display it to be recognized by the user.

The communication unit 116 of the first protective relaying module 110_1 may be connected to the server module 120 through the internal communication line 141. The communication unit 116 may transfer a data request signal from the server module 120 to the MCU 111, and transmit the event data of the first protective relaying module 110_1 outputted from the MCU 111 or memory 113 to the server module 120 according to the data request signal.

The server module 120 coupled to the first protective relaying module 110_1 may include an MCU 121, a communication unit 125, a storage unit 128 and a power unit 127.

As described above, the power unit 127 of the server module 120 may be connected to the power unit 117 of the first protective relaying module 110_1. Accordingly, the server module 120 may operate by driving power provided from the power unit 117 of the first protective relaying module 110_1.

The MCU 121 of the server module 120 may control the operation of the communication unit 125 to request data to the first protective relaying module 110_1 or transmit the stored data of the first protective relaying module 110_1 to the remote monitoring unit 150.

Furthermore, the MCU 121 may process data provided from the first protective relaying module 110_1 to store it in the storage unit 128.

The communication unit 125 of the server module 120 may include separate communication channels, for instance, a first communication channel 123 and a second communication channel 124.

The first communication channel 123 may be connected to the communication unit 116 of the first protective relaying module 110_1 through the internal communication line 141. Then, the MCU 121 of the server module 120 may request data to the first protective relaying module 110_1 through the first communication channel 123. Here, the MCU 121 may periodically request data to the first protective relaying module 110_1 through the first communication channel 123.

The second communication channel 124 may be connected to the remote monitoring unit 150 through the external communication line 145. Furthermore, the MCU 121 of the server module 120 may transmit data of the first protective relaying module 110_1 stored in the storage unit 128 to the remote monitoring unit 150 according to a data request of the remote monitoring unit 150 received through the second communication channel 124. Here, the remote monitoring unit 150 may periodically request data or request data at a specific time to the second communication channel 124 of the server module 120.

On the other hand, FIG. 5 illustrates only a configuration in which the first communication channel 123 of the server module 120 is connected to the first protective relaying module 110_1 through the internal communication line 141, but as illustrated in FIG. 4, the first communication channel 123 of the server module 120 may be connected to a plurality of protective relaying modules of the motor protection relay 100, namely, all the first protective relaying module 110_1 through the n-th protective relaying module 110_N. Accordingly, the MCU 121 of the server module 120 may request data to the protective relaying modules 110_1~110_N through the first communication channel 123.

The storage unit 128 of the server module 120 may store the data of the first protective relaying module 110_1 processed by the MCU 121.

Figure 6:
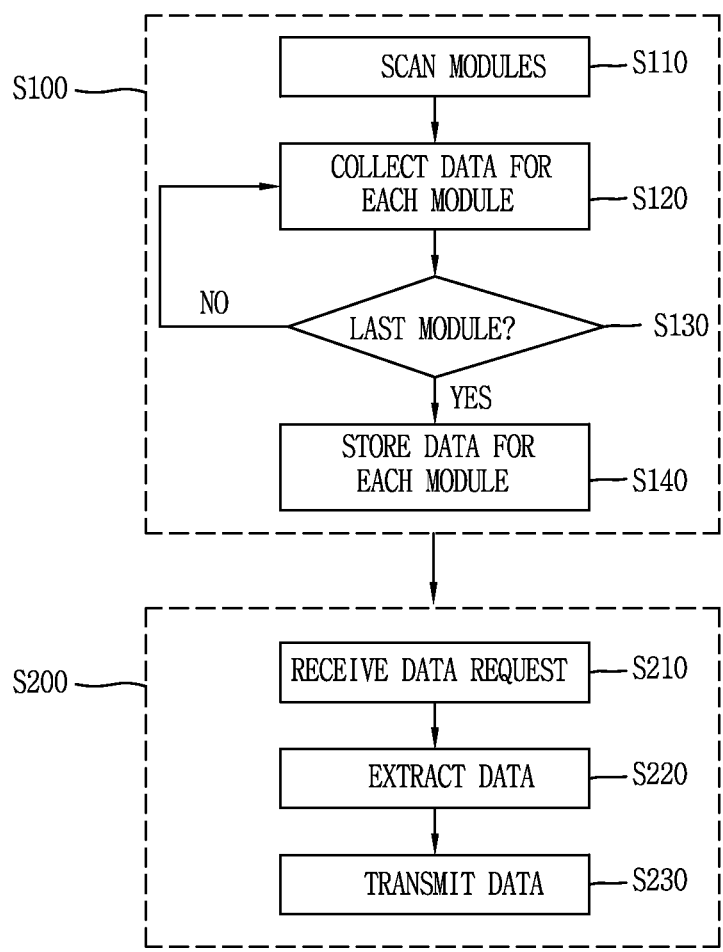
FIG. 6 is an operational flow chart for a data collection operation of a motor protective relaying system according to an embodiment of the present disclosure.
Figure 7:
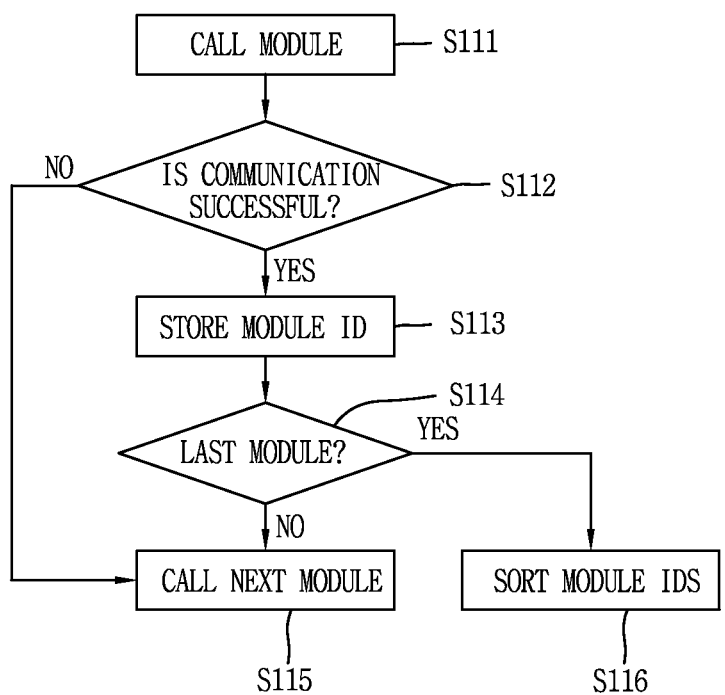
FIG. 7 is a detailed operational flow chart of module scan illustrated in FIG. 6.

FIG. 6 is an operational flow chart for a data collection operation of a motor protective relaying system according to an embodiment of the present disclosure, and FIG. 7 is a detailed operational flow chart of module scan illustrated in FIG. 6.

Referring to FIGS. 4 through 6, a data collection method of the protective relaying system 200 according to the present embodiment may include a data collection step (S100) by means of the server module 120 and a data collection step (S200) by means of the remote monitoring unit 150.

Hereinafter, the data collection step (S100) by means of the server module 120 in the protective relaying system 200 according to the present disclosure will be described.

As described above, the motor protection relay 100 may include a plurality of protective relaying modules 110_1~110_N, and the server module 120 is coupled to the first protective relaying module 110_1 of the plurality of protective relaying modules 110_1~110_N.

Then, the plurality of protective relaying modules 110_1~110_N are connected to the first communication channel 123 of the server module 120 through the internal communication line 141, and the remote monitoring unit 150 is connected to the second communication channel 124 of the server module 120 through the external communication line 145.

The server module 120 may perform module scan on the plurality of protective relaying modules 110_1~110_N through the first communication channel 123 (S110).

Module scan is monitoring whether the internal communication line 141 is properly connected between the server module 120 and the plurality of protective relaying modules 110_1~110_N. The module scan may be carried out by allowing the server module 120 to perform a predetermined communication operation to the protective relaying modules 110_1~110_N, respectively.

Referring to FIG. 7, the server module 120 may transmit a call signal to the plurality of protective relaying modules 110_1~110_N, respectively, through the first communication channel 123 and internal communication line 141 (S111).

For instance, the server module 120 may output a call signal to the first protective relaying module 110_1 among the plurality of protective relaying modules 110_1~110_N.

The first protective relaying module 110_1 receives a call signal of the server module 120 through the communication unit 116, and outputs the corresponding response signal to the first communication channel 123 of the server module 120.

In this manner, when the server module 120 outputs an output signal and the first protective relaying module 110_1 outputs a response signal corresponding to the call signal of the server module 120 to the server module 120, it may be determined that communication between the server module 120 and the first protective relaying module 110_1 is successful (S112).

Then, the server module 120 may extract unique ID information of the first protective relaying module 110_1 from a response signal provided from the first protective relaying module 110_1 to store it in the storage unit 128 (S113).

For instance, the first protective relaying module 110_1 may insert and output its own ID information into the response signal, and the server module 120 may extract and store the ID information of the first protective relaying module 110_1 from the response signal of the first protective relaying module 110_1.

Subsequently, the server module 120 may determine whether the first protective relaying module 110_1 is the last protective relaying module among the plurality of protective relaying modules 110_1~110_N in the motor protection relay 100 from the stored ID information of the first protective relaying module 110_1 (S114).

As a result of the determination, when the ID information of the first protective relaying module 110_1 is not the last protective relaying module, the server module 120 may call a protective relaying module next to the first protective relaying module 110_1, namely, the second protective relaying module 110_2, through the first communication channel 123 and internal communication line 141 (S115).

Here, a method of allowing the server module 120 to call the second protective relaying module 110_2 may be the same as that of allowing the server module 120 to call the first protective relaying module 110_1.

Subsequently, when communication between the server module 120 and second protective relaying module 110_2 is successful, the server module 120 may repeatedly perform the steps of extracting and storing the ID information of the second protective relaying module 110_2 from a response signal outputted from the second protective relaying module 110_2 (S113), determining whether the second protective relaying module 110_2 is the last protective relaying module from the stored ID information (S114) and calling a protective relaying module next to the second protective relaying module 110_2 according to a result of the determination (S115).

The foregoing repeated execution may be carried out until the server module 120 completes the scanning of the entire plurality of protective relaying modules 110_1~110_N in the motor protection relay 100, namely, communication between the server module 120 and the first protective relaying modules 110_1 through the n-th protective relaying module 110_N is successful and the ID information of the protective relaying modules are stored.

Then, when the server module 120 completes the storing of the ID information of the n-th protective relaying module 110_N, the server module 120 may sort the stored ID information of the plurality of protective relaying modules 110_1~110_N (S116).

Here, the server module 120 may sort the stored ID information from the lowest order, for instance, from the ID information of the first protective relaying module 110_1.

On the other hand, when communication between the server module 120 and the first protective relaying module 110_1 is failed, for instance in other words, when the server module 120 outputs a call signal but the first protective relaying module 110_1 does not output a response signal in response to the call signal, the server module 120 may call the second protective relaying module 110_2, and then perform the foregoing steps.

In other words, the server module 120 may sequentially communicate with each of the plurality of protective relaying modules 110_1~110_N to store the ID information of each protective relaying module 110_1~110_N according to the success or failure, thereby performing module scan.

Referring to FIG. 6, when module scan by means of the server module 120 is completed, the server module 120 may collect data from the scan-completed plurality of protective relaying modules 110_1~110_N, respectively (S120).

The server module 120 may output a data request signal to the plurality of protective relaying modules 110_1~110_N, respectively, corresponding to the ID information sorted and stored in the storage unit 128 through the first communication channel 123. Furthermore, the server module 120 may collect and store data transmitted from the plurality of protective relaying modules 110_1~110_N, respectively, namely, event data of the protective relaying module, in response to the data request signal.

Here, the server module 120 may sequentially perform data request and collection for the plurality of protective relaying modules 110_1~110_N, respectively.

In other words, the server module 120 may transmit a data request signal to a protective relaying module corresponding to the first ID information among the ID information stored in the storage unit 128, and store the resultant event data. Then, when the data store of a protective relaying module corresponding to the first ID information is completed, the server module 120 may transmit a data request signal to a protective relaying module corresponding to the second ID information, and store the resultant event data.

The server module 120 may repeatedly perform data request signal output and event data collection for the plurality of protective relaying modules as 110_1~110_N in a sequential manner according to the stored ID information (S130).

Then, when event data collection for the last protective relaying module among the plurality of protective relaying modules 110_1~110_N is completed, the server module 120 may store the collected event data of the protective relaying modules 110_1~110_N, respectively, in the storage unit 128 to match the prestored ID information of the protective relaying modules 110_1~110_N, respectively (S140).

As described above, data collection of the plurality of protective relaying modules 110_1~110_N, respectively, by means of the server module 120 will be completed within the motor protection relay 100.

Hereinafter, a data collection step (S200) by means of the remote monitoring unit 150 in the protective relaying system 200 according to the present disclosure will be described in more detail.

In a state that data for the plurality of protective relaying modules 110_1~110_N in the motor protection relay 100 is collected and stored in the storage unit 128, the server module 120 may receive a data request signal from the remote monitoring unit 150 through the external communication line 145 and second communication channel 124 (S210).

The server module 120 may extract event data for the plurality of protective relaying modules 110_1~110_N stored in the storage unit 128 in response to a data request signal of the remote monitoring unit 150 (S220).

Here, the server module 120 may extract recently stored event data among the event data stored in the storage unit 128. It is to enhance an effectiveness of event data for the plurality of protective relaying modules 110_1~110_N transferred to the remote monitoring unit 150.

Then, the server module 120 may transmit the extracted event data of the protective relaying modules 110_1~110_N to the remote monitoring unit 150 through the second communication channel 124 and external communication line 145 (S230). Here, the extracted event data of the plurality of protective relaying modules 110_1~110_N may be collectively transmitted to the remote monitoring unit 150.

On the other hand, according to the present embodiment, it is described that data collection for the plurality of protective relaying modules 110_1~110_N in the server module 120 is preceded and data collection for the server module 120 of the remote monitoring unit 150 is succeeded. However, the present disclosure may not be necessarily limited to this, and data collection by means of the server module 120 or remote monitoring unit 150 may be carried out separately or at the same time. It is because separate communication channels, namely, the first communication channel 123 and second communication channel 124 in a half-duplex mode, are provided in the communication unit 125 of the server module 120.

When data collection by means of the server module 120 or remote monitoring unit 150 is separately carried out, the server module 120 may frequently perform data collection for the plurality of protective relaying modules 110_1~110_N through the first communication channel 123 prior to receiving a data request signal from the remote monitoring unit 150 through the second communication channel 124.

Then, when the remote monitoring unit 150 transmits the data request signal to the server module 120, the server module 120 may wait for the operation of the first communication channel 123, and collectively transmit the latest data among the data of the plurality of protective relaying modules 110_1~110_N collected and stored through the second communication channel 124 to the remote monitoring unit 150.

When data transmission to the remote monitoring unit 150 is completed, the server module 120 may reactivate the first communication channel 123 in a standby state to perform data collection of the plurality of protective relaying modules 110_1~110_N again.

Furthermore, when data collection by means of the server module 120 or remote monitoring unit 150 is carried out at the same time, the server module 120 may collectively transmit the latest data among the stored data to the remote monitoring unit 150 while at the same time performing data collection and storage for the plurality of protective relaying modules 110_1~110_N through the first communication channel 123.

As described above, the protective relaying system 200 may perform the operation of coupling the server module 120 having duplex communication channels to one of the plurality of protective relaying modules 110_1~110_N in the motor protection relay 100, and collecting data for the plurality of protective relaying modules 110_1~110_N using the duplex communication channels, respectively, and collectively transmitting the collected data to the remote monitoring unit 150, thereby enhancing an efficiency of data collection of the plurality of protective relaying modules 110_1~110_N.

Furthermore, the remote monitoring unit 150 may collectively collect data from the server module 120 to reduce a data collection time, thereby enhancing an effectiveness of the collected data. In addition, the collected data may be immediately manifested to an administrator, thereby enhancing an operational reliability of the protective relaying system 200.

Although many subject matters have been specifically disclosed in the foregoing description, they should be construed as an illustration of preferred embodiments rather than a limitation to the scope of invention. Consequently, the invention should not be determined by the embodiments disclosed herein but should be determined by the claims and the equivalents thereof.

What is claimed is:

1. A protective relaying system, comprising:
    a plurality of switches respectively connected to a plurality of motors;
    a plurality of protective relaying modules respectively connected to the plurality of switches, configured to control the operation of the plurality of switches, and configured to provide a voltage and current to the motors through the plurality of switches;
    a server module configured to communicate with each of the plurality of protective relaying modules using a power received from one of the plurality of protective relaying modules, and to collect data on a status of the voltage, current and the plurality of motors from the plurality of protective relaying modules; and
    a remote monitoring unit connected to the server module, and configured to receive the data from the server module.

2. The protective relaying system of claim 1, wherein the server module comprises a first communication channel and a second communication channel, and
    the server module is connected to the plurality of protective relaying modules, respectively, through the first communication channel, and connected to the remote monitoring unit through the second communication channel.

3. The protective relaying system of claim 2, wherein the second communication channel is connected to the remote monitoring unit through one of a wired communication scheme and a wireless communication scheme to perform data communication with the remote monitoring unit in a half-duplex communication mode.

4. The protective relaying system of claim 1, wherein the server module comprises a storage unit configured to store the data, and ID information of the plurality of protective relaying modules.

5. A data collection method of a protective relaying system, the method comprising:
    storing, by a server module, ID information of a plurality of protective relaying modules;
    collecting, by the server module, data on a status of a voltage, a current and a plurality of motors from the plurality of protective relaying modules based on the stored ID information; and
    transmitting, by the server module, the data to a remote monitoring unit in response to a request of the remote monitoring unit,
    wherein the plurality of protective relaying modules are respectively connected to a plurality of switches respectively connected to the plurality of motors, configured to control the operation of the plurality of switches, and configured to provide a voltage and current to the motors through the plurality of switches, and
    wherein the server module is configured to communicate with the plurality of protective relaying modules and remote monitoring using a power received from one of the plurality of protective relaying modules.

6. The method of claim 5, wherein the storing of the ID information of the plurality of protective relaying modules comprises:
    transmitting, by the server module, a call signal to the plurality of protective relaying modules;
    receiving, by the server module, response signals corresponding to the call signal from the plurality of protective relaying modules; and
    extracting, by the server module, the ID information of the plurality of protective relaying modules from the received response signals.

7. The method of claim 5, wherein the collecting of the data from the plurality of protective relaying modules comprises:
    outputting, by the server module, a data request signal to the plurality of protective relaying modules based on the ID information; and
    collecting, by the server module, the data transmitted from the plurality of protective relaying modules in response to the data request signal.

8. The method of claim 5, wherein the server module stores the data to match the ID information.

9. The method of claim 5, wherein the server module sequentially collects the data from the plurality of protective relaying modules and collectively transmits the data to the remote monitoring unit.

* * * * *